United States Patent [19]

Tsujii et al.

[11] Patent Number: 4,716,852
[45] Date of Patent: Jan. 5, 1988

[54] APPARATUS FOR THIN FILM FORMATION USING PHOTO-INDUCED CHEMICAL REACTION

[75] Inventors: Kanji Tsujii, Nishitama; Yusuke Yajima, Musashino; Seiichi Murayama, Kokubunji, all of Japan

[73] Assignee: Hitachi, Ltd., Tokyo, Japan

[21] Appl. No.: 848,485

[22] Filed: Apr. 7, 1986

[30] Foreign Application Priority Data

Apr. 8, 1985 [JP] Japan .................................. 60-72682

[51] Int. Cl.⁴ .............................................. C23C 16/48
[52] U.S. Cl. .................................. 118/720; 118/722; 118/723; 118/715
[58] Field of Search .................. 118/720, 722, 723, 715

[56] References Cited

U.S. PATENT DOCUMENTS 4,447,469 5/1984 Peters .................................... 427/85
4,565,157 1/1986 Brors .................................... 118/719
4,636,401 1/1987 Yamazaki .............................. 427/53.1

Primary Examiner—Richard R. Bueker
Attorney, Agent, or Firm—Antonelli, Terry, & Wands

[57] ABSTRACT

An apparatus according to the present invention for thin film formation using a photo-induced chemical reaction comprises a reaction chamber in which a substrate can be set, means to introduce a reactive gas into the reaction chamber for the purpose of causing a surface of the substrate to adsorb the reactive gas, means to evacuate the reaction chamber, means to irradiate the substrate surface having adsorbed the reactive gas with photon energy for the purpose of forming a nucleus required for growing a film on the substrate surface, means to generate metastable excited molecules which can react with the reactive gas to decompose it, and means to introduce the reactive gas and the metastable excited molecules into the reaction chamber for the purpose of growing the film on the substrate formed with the nucleus on the basis of the nucleus.

16 Claims, 9 Drawing Figures

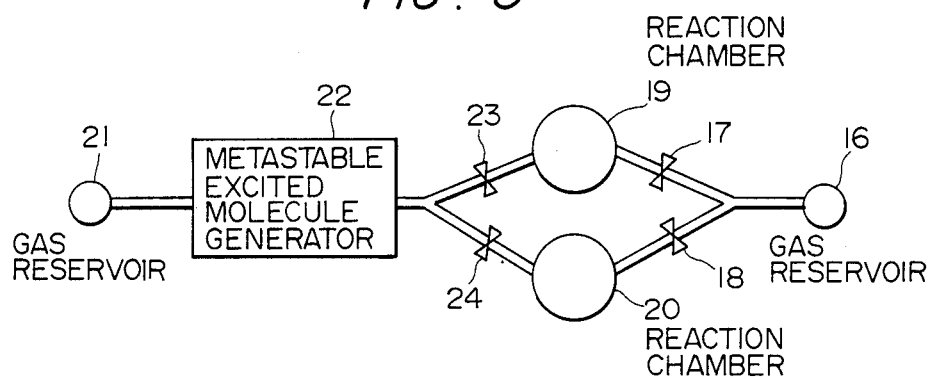
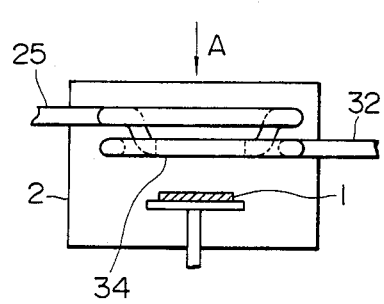
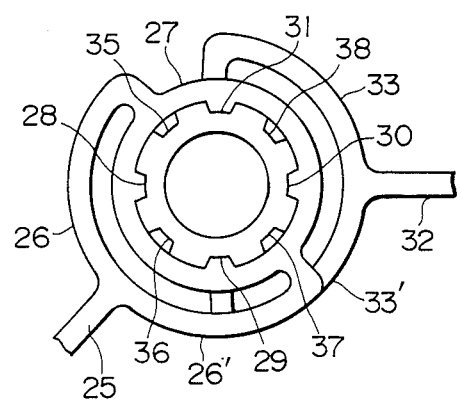

APPARATUS FOR THIN FILM FORMATION USING PHOTO-INDUCED CHEMICAL REACTION

BACKGROUND OF THE INVENTION

The present invention relates to an apparatus for the film formation of a semiconductor, a metal or the like which includes the step of irradiating the surface of a substrate with photon energy in case of forming a desired film.

In view of the situation in which the manufacturing processes of large scale integrated circuits (LSI's) have become smaller with smaller feature sizes, attention has been paid to a photo-induced process in which a substrate surface is formed with a thin film by irradiating it with a photon beam to induce a gas phase chemical reaction or a substrate surface reaction. The main reasons the photo-induced process appears promising are the realization of a low temperature process, the reduction of damage to a substrate, and excellent spatial selectivity of the reaction, i.e., the film formation reaction proceeds on only the substrate surface irradiated with the photon beam. According to a known example obtained by a film formation experiment using a photon beam (Nikkei Electronics, Feb. 15, 1982, page 122), it is claimed that, when a substrate is exposed to a reactive gas and the surface of the substrate is thereafter irradiated with a focused laser beam in the state in which a reaction chamber is evacuated to a high vacuum, a molecular layer adsorbed to the substrate is decomposed to form the nucleus of a reaction product on the substrate surface, and that, when the substrate surface is subsequently irradiated with the unfocused laser beam in the state in which the reaction chamber is filled with the reactive gas, the growth of a film proceeds on the nucleus. This first known example is developed into the second known example disclosed in Japanese Patent Application Laid-open No. 59-40525. In this second known example, a substrate surface is irradiated with the first light to form an area serving as the nucleus of film formation, whereupon the second light having a wavelength suited to the film formation is projected into a reaction chamber to selectively form a film on the nucleus.

In both the known examples, the method in which the photon energy of a laser or the like is projected is adopted in the course of the film formation. As such a light source for inducing the film formation reaction, an excimer laser of ArF or the like having a high intensity in the ultraviolet region is suitable. The excimer laser, however, has had the problems that it is expensive, that the power lowers gradually with operation, and that the laser gas must be exchanged at regular intervals.

SUMMARY OF THE INVENTION

The present invention has for its object to provide an apparatus in which, at a film formation process to be performed after an area as a nucleus has been formed on a substrate surface, photon energy is projected for film growth without using an excimer laser or the like which is expensive.

For accomplishing this object, the present invention is characterized in that an apparatus for thin film formation using a photo-induced chemical reaction is constructed by comprising a reaction chamber in which a substrate can be set, means to introduce a reactive gas into said reaction chamber for the purpose of causing a surface of the substrate to adsorb the reactive gas, means to evacuate said reaction chamber, means to irradiate the substrate surface having adsorbed the reactive gas with photon energy for the purpose of forming a nucleus required for growing a film on the substrate surface, means to generate metastable excited molecules which can react with the reactive gas to decompose it, and means to introduce the reactive gas and the metastable excited molecules into said reaction chamber for the purpose of growing the film on the substrate formed with the nucleus and on the basis of the nucleus.

Owing to such a construction, film formation utilizing a photo-induced chemical reaction can be performed without using the excimer laser which has the problems mentioned before.

BRIEF DESCRIPTION OF THE DRAWINGS

FIG. 3 is a diagram for explaining the third embodiment of the present invention;

FIGS. 4A and 4B are views showing the fourth embodiment of the present invention, in which FIG. 4A is a front view of the interior of a reaction chamber, while FIG. 4B is a top view showing means to introduce a reactive gas and metastable excited molecules;

DESCRIPTION OF THE PREFERRED EMBODIMENTS

Figure 1:
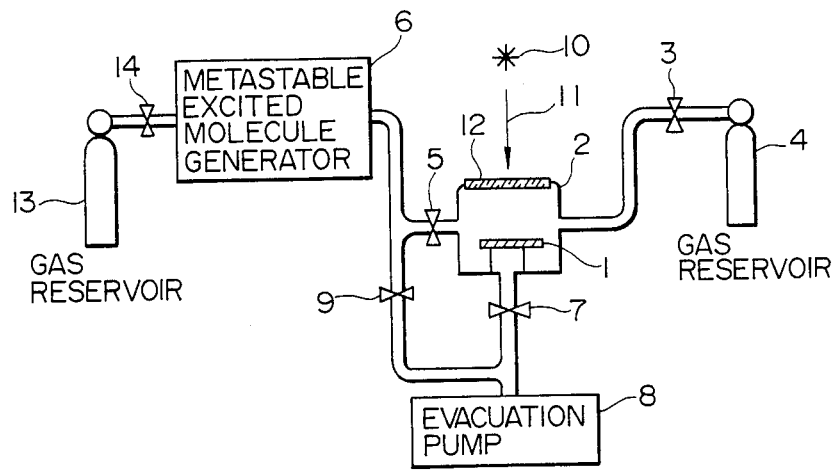
FIG. 1 is an arrangement diagram showing the first embodiment of an apparatus for film formation according to the present invention.

Now, embodiments of the present invention will be described with reference to the drawings. FIG. 1 shows the arrangement of the first embodiment of an apparatus for film formation according to the present invention. Referring to FIG. 1, a substrate 1 is set in a reaction chamber 2, to which a reactive gas reservoir 4 and a generation part 6 for metastable excited molecules are respectively connected through a valve 3 and a valve 5, and to which an evacuation pump 8 is connected through a valve 7. The metastable excited molecule generator 6 and the evacuation pump 8 are coupled through a valve 9. After the reaction chamber 2 has been evacuated by the use of the evacuation pump 8, a reactive gas is leaked from the reactive gas reservoir 4 and is introduced into the reaction chamber 2 via the valve 3. In the state in which the reaction chamber 2 is filled up with the reactive gas, or in the state in which the reactive gas remaining in the reaction chamber 2 has been discharged by closing the valve 3 and opening the valve 7, the surface of the substrate 1 within the reaction chamber 2 is irradiated through a light window 12 with a photon beam 11 emitted from a light source 10.

Owing to the above steps, a photo-induced chemical reaction proceeds on the photo-irradiated area of the surface of the substrate 1, and a part corresponding to a nucleus for film formation is formed. The above steps shall be called the "nucleus forming process" in this specification. Meanwhile, during the nucleus forming process, a gas leaked from a gas reservoir 13 for the production of the metastable excited molecules of nitrogen, a rare gas or the like is transformed into the metastable excited molecules by the metastable excited molecule generator 6 via a valve 14 and is discharged by the evacuation pump 8 via the valve 9. Upon the completion of the nucleus forming process, while the reactive gas of the reactive gas reservoir 4 is being leaked into the reaction chamber 2, the valves 5 and 7 are opened and the valve 9 is closed, whereby the metastable excited molecules produced in the metastable excited molecule generator 6 are introduced into the reaction chamber 2. Microwave discharge or dielectric discharge is effective as an expedient for generating the metastable excited molecules. For example, in a case where the nitrogen gas is utilized as the gas for producing the metastable excited molecules, it is transformed into the metastable excited molecules of $N_2^*(A^3\Sigma u+)$ in the metastable excited molecule generator 6. Since the molecule has an excitation energy of 6.17 eV and a lifetime of 2.1 seconds, it remains in the excited state even at the stage at which it has entered the reaction chamber 2 considerably distant from the metastable excited molecule generator 6. As a result, the metastable excited molecules and the reactive gas leaked from the reactive gas reservoir 4 into the reaction chamber 2 react effectively to decompose the reactive gas, and a film formation reaction proceeds on the nucleus formed on the substrate 1 by the nucleus forming steps. The steps after the nucleus forming process shall be called the "film forming process" in this specification.

Figure 2:
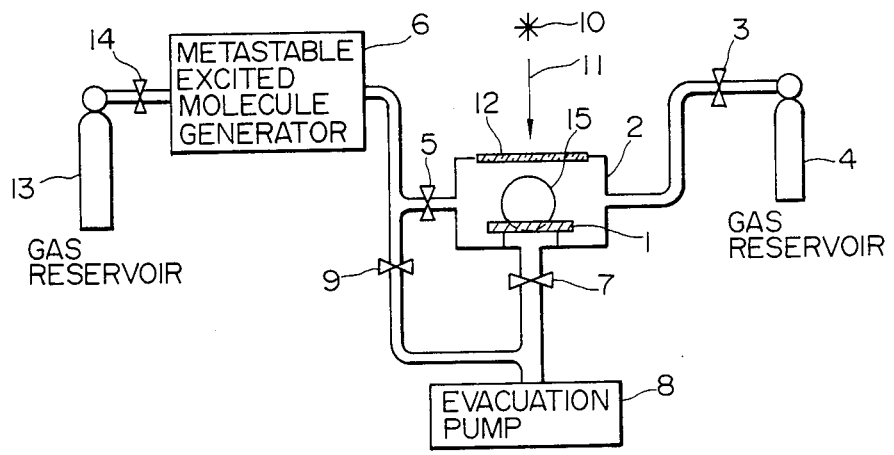
FIG. 2 is a diagram showing the arrangement of the apparatus of the second embodiment of the present invention.

In performing the film forming process after the completion of the nucleus forming process in the foregoing first embodiment, the second embodiment of the present invention shown in FIG. 2 introduces the metastable excited molecules into the reaction chamber 2 and simultaneously projects another photon energy, thereby intending to promote the film formation reaction by utilizing the synergistic effect of the two. Except for the second light window 15 provided in the reaction chamber 2, the present embodiment is the same as the first embodiment shown in FIG. 1 in all the other constituents of the apparatus. The numerals of the respective portions assigned in FIG. 2 correspond to the respective numerals in FIG. 1. As regards the steps until the substrate 1 is formed with the nucleus for film formation, the procedure of the first embodiment may be followed. Thereafter, when the metastable excited molecules produced by the metastable excited molecule generator 6 are introduced into the reaction chamber 2, a photon beam emitted from the second light source (not shown) may be projected into the reaction chamber 2 through the second light window 15. Effective as the second light source is a light source which emits light of a wavelength suited to decompose, with photon energy, the reactive gas introduced into the reaction chamber 2 (for example, a $CO_2$ laser, a high-pressure mercury discharge lamp or a high-frequency electrodeless discharge lamp containing any of various metal halides, or an excimer laser). In the present embodiment, during or instead of the projection of the light of the second light source into the reaction chamber 2 through the light window 15, the light 11 from the first light source 10 may well be projected on the substrate 1 through the light window 12. At that time, in order to raise the energy density of the photon beam 11, this beam 11 may either be focused or be projected in the unfocused state.

The third embodiment of the present invention in FIG. 3 illustrates a case where two reaction chambers are provided. It is an apparatus for eliminating one problem involved in the first and second embodiments, namely, the disadvantage that the metastable excited molecules are consumed in vain through the bypass tube having the valve 9 while the nucleus forming process is performed. A reactive gas leaked from a reactive gas reservoir 16 is branched to flow into either the first reaction chamber 19 or the second reaction chamber 20 through the manipulation of valves 17 and 18. A gas leaked from a gas reservoir 21 for producing metastable excited molecules is transformed by a metastable excited molecule generator 22 into the metastable excited molecules, which flow into either the first reaction chamber 19 or the second reaction chamber 20 through the opening and closing operations of valves 23 and 24. For example, while the nucleus forming process is executed in the first reaction chamber 19, the metastable excited molecules flow via the valve 24 and can perform the film forming process for a substrate set in the second reaction chamber 20. When the film formation on the substrate in the second reaction chamber 20 has been completed and the nucleus forming process in the first reaction chamber 19 has been completed, the valve 23 is opened and the valve 24 is closed, whereby the metastable excited molecules are introduced into the first reaction chamber 19 so as to perform the film forming process for a substrate subjected to the nucleus forming process and set in the first reaction chamber 19. Meantime, in the second reaction chamber 20, the nucleus forming process is performed for a new substrate. In FIG. 3, the light projection means and the evacuation pump are omitted. Owing to the arrangement as described above, the useless consumption of the metastable excited molecules as experienced in the first and second embodiments can be prevented, and since the nucleus forming process and the film forming process can be performed in parallel, the throughput of the film formation can be enhanced. Although the present embodiment shown in FIG. 3 is provided with the two reaction chambers 19 and 20, reaction chambers can be increased in a desired number. In this case, the appropriate number of the reaction chambers should desirably be calculated with a criterion set at the ratio between a period of time required for the nucleus forming process and a period of time required for the film forming process.

FIGS. 4A and 4B show partial setup views of the fourth embodiment which is constructed so that, in introducing metastable excited molecules into a reaction chamber, the metastable excited molecules may uniformly react with a reactive gas. FIG. 4A is a front view of the interior of the reaction chamber, while FIG. 4B is a top view illustrative of devices for introducing the reactive gas and the metastable excited molecules. In FIG. 4A, a light window and a gas evacuation pump with which the reaction chamber is furnished likewise to those of the first embodiment are omitted. The reactive gas is introduced into an inlet tube 25 and branched tubes 26, 26' and further into a circular tube 27, and is injected into the reaction chamber 2 via inlet ports 28, 29, 30, 31 provided in the circular tube 27. In case of performing the nucleus forming process in the present embodiment, a substrate 1 may be irradiated with light containing a wavelength component suitable for nucleus formation in a direction A indicated in FIG. 4A, under the state under which the reaction chamber 2 is filled up with the reactive gas or after the reactive gas has been evacuated by the evacuation pump. In case of subsequently performing the film forming process, the metastable excited molecules may be introduced into the reaction chamber 2 while the reactive gas is being leaked into the reaction chamber 2 through the inlet ports 28, 29, 30, 31 provided in the circular tube 27. A gas transformed into the metastable excited molecules by a metastable excited molecule generator (not shown) is introduced into a tube 32 and branched tubes 33, 33', and further into the reaction chamber 2 from inlet ports 35, 36, 37, 38 provided in a circular tube 34. In the present embodiment, the inlet ports 28, 29, 30, 31 which extend downward of the circular tube 27 for leading the reactive gas are provided to be even with the circular tube 34 for leading the metastable excited molecules disposed under the circular tube 27. That is, the inlet ports 28, 29, 30, 31 for the reactive gas and the inlet ports 35, 36, 37, 38 for the metastable excited molecules are provided at even positions at mutually equal intervals. As a result, in the fourth embodiment, angles (viewed from the center of the circular tube 34) defined between the inlet port 28 for the reactive gas and the inlet ports 35 and 36 for the metastable excited molecules are 45°.

Figure 5:
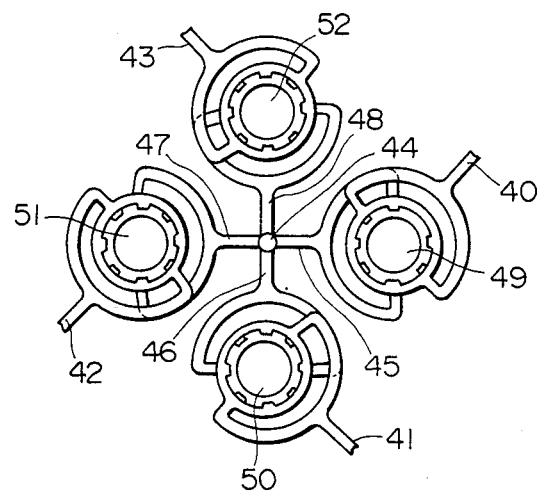
FIG. 5 is a view showing means to introduce a reactive gas and metastable excited molecules in the fifth embodiment of the present invention.

The fifth embodiment shown in FIG. 5 is an apparatus which is used when films are simultaneously formed on a plurality of substrates, and the figure illustrates part of a construction in the case of simultaneously processing four substrates. The present embodiment is so constructed that four of the devices shown in the fourth embodiment are combined in parallel. Although not illustrated, a reactive gas is leaked from a reactive gas reservoir separately disposed and is passed via a flow rate regulator, whereupon it is branched into four branched tubes and flows into tubes 40, 41, 42, 43 shown in FIG. 5. The reactive gas is then introduced into reaction chambers by the paths described in the fourth embodiment shown in FIGS. 4A and 4B. On the other hand, metastable excited molecules are passed through branched tubes 45, 46, 47, 48 extending radiately from a tube 44 and are thereafter introduced into the reaction chambers by paths similar to those described in the fourth embodiment. In FIG. 5, numerals 49, 50, 51, 52 indicate the respective substrates.

Figure 6:
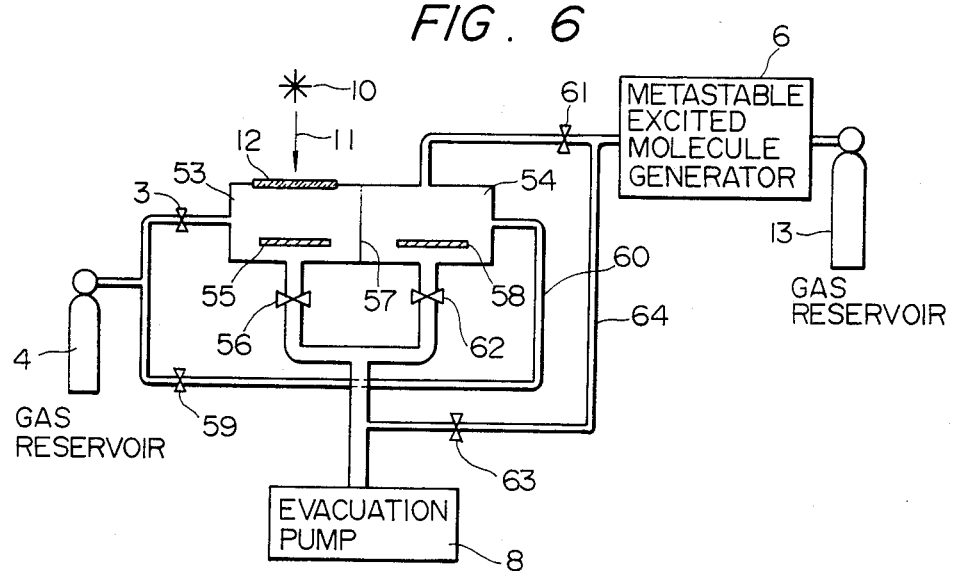
FIG. 6 is an arrangement diagram of the apparatus of the sixth embodiment of the present invention.

The sixth embodiment shown in FIG. 6 exhibits in a construction in which the first reaction chamber 53 for executing the nucleus forming process and the second reaction chamber 54 for executing the film forming process are dividually disposed. After introducing a substrate 55 into the first reaction chamber 53, a gas in the first reaction chamber 53 is discharged through a valve 56 by an evacuation pump 8. Subsequently, a valve 3 is opened, and a reactive gas is leaked from a reactive gas reservoir 4 and introduced into the first reaction chamber 53. Under the state under which the first reaction chamber 53 is filled up with the reactive gas, or under the state under which the reactive gas remaining in the first reaction chamber 53 has been discharged by means of the evacuation pump 8 by closing the valve 3 and opening the valve 56, a photon beam 11 emitted from a light source 10 is projected on the surface of the substrate 55 through a light window 12. After the nucleus forming process has ended via the above steps, a partition wall 57 between the first reaction chamber 53 and the second reaction chamber 54 is opened, and the substrate 55 is transferred into the second reaction chamber 54 evacuated to a vacuum beforehand. At this point of time, the substrate 55 becomes a substrate 58. After the transfer of the substrate 58 into the second reaction chamber 54, the partition wall 57 is closed and a valve 59 is opened, and the reactive gas is introduced into the second reaction chamber 54 via a tube 60. Simultaneously therewith, a gas leaked from a gas reservoir 13 is transformed through a metastable excited molecule generator 6 into metastable excited molecules, which are introduced into the second reaction chamber 54 by opening valves 61 and 62 and with which the film forming process is caused to proceed. At that time, a valve 63 is closed to interrupt the flow of the metastable excited molecules to a bypass tube 64. While the film forming process is proceeding in the second reaction chamber 54, the nucleus forming process is performed for a substrate 55 introduced anew in the first reaction chamber 53. With the present embodiment, while the nucleus forming process is being executed in the first reaction chamber 53, the film forming process can be performed in parallel in the second reaction chamber 54. Besides, the embodiment is effective to mitigate the lowering of an optical transmittance attributed to the formation of a thin film on the inner surface of the light window, the thin film formation posing a problem in the first to third embodiments. This problem in the first to third embodiments arises in such a manner that, simultaneously with the formation of the nucleus on the substrate surface by the photon irradiation, a similar nucleus formation reaction takes place also in the light transmitted area of the inner surface of the light window 12 lying in contact with the reactive gas, whereupon in the subsequent film forming process employing the metastable excited molecules, a film formation reaction takes place also on the inner surface of the light window 12. Since, with the present embodiment shown in FIG. 6, the film forming process is performed in the second reaction chamber 54, the formation of the thin film on the inner surface of the light window 12 as described above can be sharply reduced.

Figure 7:
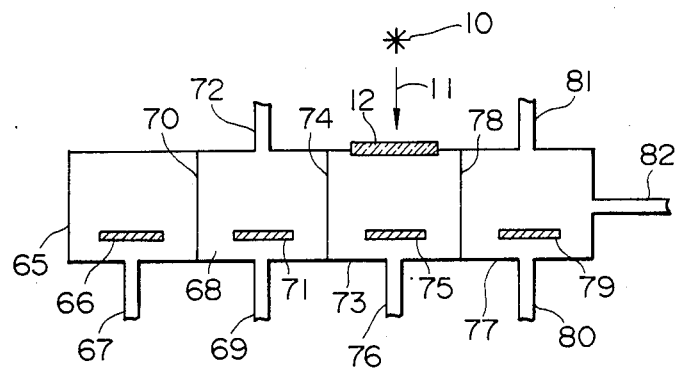
FIG. 7 is a view showing a reaction chamber portion in the seventh embodiment of the present invention.

The seventh embodiment shown in FIG. 7 illustrates an example of an apparatus with which the film formation reaction is prevented from proceeding on the inner surface of the light window, and accordingly the light window is hardly blurred. FIG. 7 is a view showing a reaction chamber portion. A substrate 66 is set in an introduction chamber 65, the interior of which is evacuated by an evacuation tube 67 thereby to be held at a high vacuum. The adjoining first reaction chamber 68 is also evacuated and put under a vacuum by an evacuation tube 69 beforehand. With the present embodiment, in case of subjecting the surface of the substrate 66 to a nucleus formation reaction, a partition wall 70 between the introduction chamber and the first reaction chamber 68 is first opened so as to transfer the substrate 66 into the first reaction chamber 68. At this point of time, the substrate 66 becomes the state of a substrate 71. Next, the partition wall 70 is closed, a reactive gas is introduced from an inlet tube 72 into the first reaction chamber 68, and the surface of the substrate 71 is caused to adsorb the reactive gas. Subsequently, the reactive gas remaining in the first reaction chamber 68 is discharged through an evacuation tube 69. At the stage at which the interior of the first reaction chamber 68 has reached a predetermined pressure, a partition wall 74 between the first reaction chamber 68 and the second reaction chamber 73 is opened so as to transfer the substrate 71 into the second reaction chamber 73. At this point of time, the substrate 71 becomes the state of a substrate 75. Desirably the interior of the second reaction chamber 73 is evacuated to a vacuum through an evacuation tube 76 prior to the transfer. After the substrate 75 has been transferred into the second reaction chamber 73 as described above, the partition wall 74 is closed, and a photon beam 11 emitted from a light source 10 is projected on the surface of the substrate 75 through a window 12. A nucleus is formed on the surface of the substrate 75 via the above process. Next, a partition wall 78 between the second reaction chamber 73 and the third reaction chamber 77 is opened so as to convey the substrate 75 into the third reaction chamber 77. At this point of time, the substrate 75 becomes the state of a substrate 79. Subsequently, the partition wall 78 is closed, and while the interior of the third reaction chamber 77 is being evacuated through a tube 80, a reactive gas from a tube 81 and metastable excited molecules from a tube 82 are respectively introduced into the third reaction chamber 77 to carry forward a film formation reaction on the part of the substrate 79 formed with the nucleus.

With the present embodiment, the substrate surface is caused to adsorb the reactive gas in the first reaction chamber 68 and is irradiated with the photon energy 11 in the second reaction chamber 73, so that the inner surface of the light window 12 provided in the second reaction chamber 73 does not adsorb the reactive gas. Accordingly, even in the case where the photon beam 11 is projected from the light source 10, a nucleus resulting from the photo-induced reaction does not adhere on the inner surface of the light window 12, and the optical transmittance of the light window 12 can be maintained without lowering. Also in the present embodiment, while the film forming process is being executed in the third reaction chamber 77, by way of example, the process of the reactive gas adsorption and the process of the photon projection can be respectively performed in the preceding first reaction chamber 68 and second reaction chamber 73.

Figure 8:
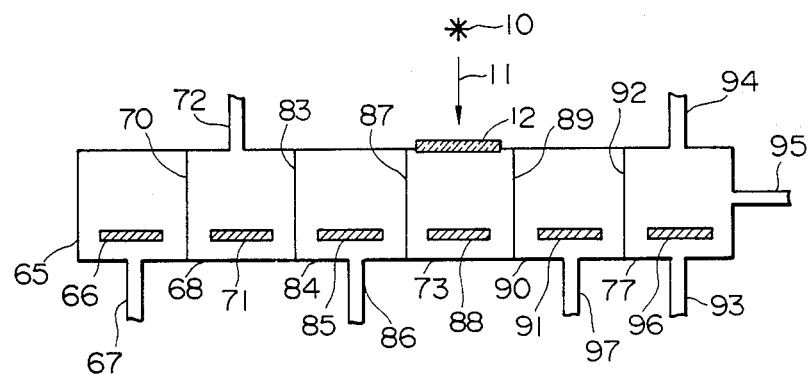
FIG. 8 is a view showing the setup of a reaction chamber in the eighth embodiment of the present invention.

The eighth embodiment shown in FIG. 8 is an apparatus for more enhancing the efficiency of the processes described in the seventh embodiment. The introduction chamber 65 is always evacuated by the evacuation tube 67 under the state under which the substrate 66 is set therein. In the first reaction chamber 68 adjoining the introduction chamber 65, the substrate 71 transferred from the introduction chamber 65 by opening the partition wall 70 is set. In the first reaction chamber 68, the reactive gas is always introduced through the inlet tube 72 so as to perform the process for causing the surface of the substrate 71 to adsorb the reactive gas. When the process of the reactive gas adsorption has been completed, a partition wall 83 is opened, and the substrate 71 is transferred into the next chamber 84 to be set at the position of a substrate 85. The chamber 84 is always evacuated through an evacuation tube 86. Therefore, when the partition wall 83 has been closed upon the completion of the transfer of the substrate 85, the reactive gas having flowed into the chamber 84 is discharged out of the system, and the chamber 84 reaches the original degree of vacuum. Meantime, a partition wall 87 between the chamber 84 and the second reaction chamber 73 is kept closed, so that the reactive gas which has flowed from the first reaction chamber 68 into the chamber 84 at the opening of the partition wall 83 does not flow into the second reaction chamber 73. After the chamber 84 has reached a predetermined degree of vacuum, the partition wall 87 is opened so as to convey the substrate 85 into the second reaction chamber 73. Then, the substrate 85 becomes the state of a substrate 88. After the partition wall 87 has been closed, the photon beam 11 emitted from the light source 10 is projected on the substrate 88 through the light window 12 so as to cause the nucleus formation reaction to proceed on the surface of this substrate 88. After the end of the process of the photon projection, a partition wall 89 is opened, and the substrate 88 is conveyed into the next chamber 90 and becomes the state of a substrate 91. After the partition wall 89 has been closed, a partition wall 92 is opened, and the substrate 91 is transferred into the third reaction chamber 77. The third reaction chamber 77 is always evacuated through a tube 93, and the reactive gas through a tube 94 and the metastable excited molecules through a tube 95 are caused to flow thereinto. The film formation reaction is thus carried forward in the nucleus part of the substrate 96 transferred into the third reaction chamber 77. When the substrate 91 is conveyed into the third reaction chamber 77 by opening the partition wall 92 as described above, the reactive gas and the metastable excited molecules to be respectively introduced into the third reaction chamber 77 via the tube 94 and the tube 95 flow partly into the chamber 90. Since, however, the partition wall 89 is closed, they do not diffuse even into the second reaction chamber 73. The partition wall 92 is closed after the transfer of the substrate 91 into the third reaction chamber 77, and the chamber 90 immediately returns into the original vacuum state because it is always evacuated through a tube 97. As thus far described, according to the eighth embodiment, the new rooms 84 and 90 furnished with the evacuation function are respectively provided between the first reaction chamber 68 and the second reaction chamber 73 and between the second reaction chamber 73 and the third reaction chamber 77 described in the seventh embodiment, and the opening and closing timings of the partition walls disposed between the adjacent chambers are controlled, thereby to bring forth the effect that the process for nucleus formation and the process for film formation on the substrates can be performed while both the reactive gas to be introduced into the first reaction chamber 68 and the reactive gas as well as the metastable excited molecules to be introduced into the third reaction chamber 77 are kept flowing in continuously without establishing the control steps of inflow and cessation, and to the exclusion of the problem that the optical transmittance of the light window 12 lowers due to the formation of the thin film on the inner surface of the light window 12.

Although, in each of the embodiments shown in FIGS. 1 through 8, the aspect of performance in which the surface of the substrate is irradiated with the photon beam 11 emitted from the light source 10 is illustrated, light containing pattern information may well be projected at the stage of the photon irradiation. Thus, a photo-induced reaction reflective of the pattern information proceeds on the substrate surface, and a nucleus exhibitive of a desired pattern can be formed on the substrate. As an expedient for reflecting the pattern information on the substrate, there is a method in which a mask is interposed between the light source and the substrate. In setting the mask, it is possible to apply a measure in which a mask equal in size to a desired pattern image is set in close proximity to the substrate surface and in parallel with the substrate, or a measure which utilizes optics for reduction projection. In addition, as a method in which a laser is used as the light source so as to form the nucleus in only a laser irradiated area, it is possible to apply, for example, (1) a measure wherein the spatial position of a laser beam is fixed, and a substrate stage is scanned in the directions of two dimensions horizontal to the substrate, thereby to depict a desired pattern, (2) a measure wherein a laser beam emitted from the laser source is scanned in the state in which the position of the substrate is fixed, or (3) a measure wherein a laser beam emitted from the laser source is branched into two optical paths by a semitransparent mirror, and both the beams are caused to interfere, thereby to form a very small interference fringe pattern on the substrate surface. As means for realizing the above measure (2), it is effective to feed an optical fiber cable with the laser beam emitted from the laser source, to guide the beam into a photocoupler having a built-in microlens and to move the photocoupler. The 'method of irradiation with light containing pattern information' in the present invention shall include the above measure of setting the mask, and the measures of exploiting the laser beams mentioned in the items (1), (2) and (3).

As the reactive gas which is used when forming the nucleus and the film on the substrate surface in the present invention, it is possible to apply any of hydrides [such as $AsH_3$ and $SiH_4$], organometallic compounds [such as $Ga(CH_3)_3$ and $Al(CH_3)_3$], metal carbonyl compounds [such as $W(CO)_6$ and $Mo(CO)_6$], etc. which are ordinarily employed in semiconductor processes. Although, in any of the embodiments of the present invention, one kind of reactive gas is indicated, the present invention is also effective for a system which uses a plurality of kinds of gases conjointly.

Needless to say, it is effective for the process of the present invention to apply heating means to the substrate or the reaction chamber. Besides the aspect which utilizes the synergistic effect of light and metastable excited molecules as explained in the second embodiment shown in FIG. 2 is applicable to all the other embodiments.

As described above, the apparatus for thin film formation according to the present invention can form a thin film at a low temperature without using an expensive excimer laser or the like in a film forming process which is carried out on the basis of nucleus formation.

What is claimed is:

1. An apparatus for thin film formation using a photo-induced chemical reaction comprising a reaction chamber in which a substrate can be set, means to introduce a reactive gas into said reaction chamber for the purpose of causing a surface of the substrate to adsorb the reactive gas, means to evacuate said reaction chamber, means to irradiate the substrate surface having adsorbed the reactive gas with photon energy for the purpose of forming a nucleus required for growing a film on the substrate surface, means to generate metastable excited molecules which can react with the reactive gas to decompose it, said means to generate metastable excited molecules being located outside said reaction chamber, and means to introduce the reactive gas and the metastable excited molecules into said reaction chamber for the purpose of growing the film on the substrate formed with the nucleus and on the basis of the nucleus.

2. An apparatus for thin film formation using a photo-induced chemical reaction as defined in claim 1, wherein said reaction chamber includes means to project the photon energy while the metastable excited molecules are being introduced.

3. An apparatus for thin film formation using a photo-induced chemical reaction as defined in claim 1, wherein said reaction chamber is constructed of a plurality of reaction chambers, and includes means capable of switchingly performing the introduction and discharge of the reactive gas or the metastable excited molecules.

4. An apparatus for thin film formation using a photo-induced chemical reaction as defined in claim 1, wherein said means to introduce the reactive gas and said means to introduce the metastable excited molecules are circular tube structures each of which has a plurality of openings directed toward a center thereof.

5. An apparatus for thin film formation using a photo-induced chemical reaction as defined in claim 1, wherein said reaction chamber is separated into a first reaction chamber in which the substrate adsorbs the reactive gas and the photon energy is projected, and a second reaction chamber in which the metastable excited molecules are exerted.

6. An apparatus for thin film formation using a photo-induced chemical reaction as defined in claim 1, wherein said reaction chamber is separated into a first reaction chamber in which the substrate adsorbs the reactive gas, a second reaction chamber in which the substrate is irradiated with the photon energy, and a third reaction chamber in which the metastable excited molecules are exerted on the substrate irradiated with the photon energy.

7. An apparatus for thin film formation using a photo-induced chemical reaction as defined in claim 6, wherein rooms which are evacuated are respectively disposed between said first reaction chamber and said second reaction chamber and between said second reaction chamber and said third reaction chamber.

8. An apparatus for thin film formation using a photo-induced chemical reaction as defined in claim 1, wherein the photon energy contains pattern information obtained by passing light through a mask.

9. An apparatus for thin film formation using a photo-induced chemical reaction as defined in claim 1, wherein the photon energy contains pattern information obtained by employing a laser beam.

10. An apparatus for thin film formation using a photo-induced chemical reaction as defined in claim 1, wherein said means to introduce a reactive gas into said reaction chamber comprises means to introduce a reactive gas made of a material selected from the group consisting of hydrides, organometallic compounds and metalcarbonyl compounds.

11. An apparatus for thin film formation using a photo-induced chemical reaction as defined in claim 1, wherein said means to generate metastable excited molecules comprises means for generating metastable excited molecules of a material selected from the group consisting of nitrogen and rare gases.

12. An apparatus for thin film formation using a photo-induced chemical reaction as defined in claim 1, further comprising means for projecting a photon beam from a light source into said reaction chamber while the metastable excited molecules are being introduced.

13. An apparatus for thin film formation using a photo-induced chemical reaction as defined in claim 12, wherein said photon beam has a wavelength capable of decomposing said reactive gas.

14. An apparatus for thin film formation using a photo-induced chemical reaction as defined in claim 13, wherein said light source is a $CO_2$ laser, a high-pressure mercury discharge lamp, a high-frequency electrodeless discharge lamp, or an excimer laser.

15. An apparatus for thin film formation using a photo-induced chemical reaction as defined in claim 1, wherein said thin film is made of a semiconductor material.

16. An apparatus for thin film formation using a photo-induced chemical reaction as defined in claim 1, wherein said thin film is made of a metal material.

* * * * *